(12) United States Patent
Um

(10) Patent No.: US 8,403,508 B2
(45) Date of Patent: Mar. 26, 2013

(54) KEYPAD WITH A LIGHT GUIDE PAD

(75) Inventor: Keetae Um, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 406 days.

(21) Appl. No.: 12/820,550

(22) Filed: Jun. 22, 2010

(65) Prior Publication Data

US 2010/0326803 A1 Dec. 30, 2010

(30) Foreign Application Priority Data

Jun. 24, 2009 (KR) .................... 10-2009-0056535

(51) Int. Cl.
*F21V 7/04* (2006.01)

(52) U.S. Cl. .................. 362/23.16; 362/23.09; 362/600; 362/612

(58) Field of Classification Search .................... 362/23, 362/26, 27, 85, 602–605, 23.01, 23.09, 23.16; 200/312, 310; 250/221, 227.22
See application file for complete search history.

(56) References Cited

U.S. PATENT DOCUMENTS

| | | | | |
|---|---|---|---|---|
| 7,086,768 | B2 * | 8/2006 | Suwa et al. | 362/555 |
| 7,498,560 | B2 * | 3/2009 | Hwang et al. | 250/221 |
| 7,736,047 | B2 * | 6/2010 | Ohashi et al. | 362/631 |
| 7,963,688 | B2 * | 6/2011 | Satake | 362/616 |
| 8,155,489 | B2 * | 4/2012 | Saarikko et al. | 362/628 |
| 2008/0030975 | A1 * | 2/2008 | Miyashita et al. | 362/26 |
| 2008/0099668 | A1 * | 5/2008 | Hwang et al. | 250/227.31 |

* cited by examiner

*Primary Examiner* — Bao Q Truong

(74) *Attorney, Agent, or Firm* — Saliwanchik, Lloyd & Eisenschenk

(57) ABSTRACT

The present disclosure relates to a keypad, wherein the keypad includes a light guide pad, a light source allowing light to be incident on the light guide pad, a sensor detecting quantity of light having passed the light guide pad, and a light quantity changer changing the quantity of light having passed the light guide pad.

19 Claims, 2 Drawing Sheets

KEYPAD WITH A LIGHT GUIDE PAD

CROSS-REFERENCE TO RELATED APPLICATION

This application claims the benefit under 35 U.S.C. §119 of Korean Patent Application No. 10-2009-0056535, filed Jun. 24, 2009, which is hereby incorporated by reference in its entirety.

BACKGROUND OF THE INVENTION

1. Field of the Invention

The present disclosure relates to a keypad with a light guide pad, and more particularly to a keypad with a light guide pad connectively attached with a pattern sheet printed with a letter or a figure to an upper side of a light guide pad connectively attached with a light source for generating light and a sensor for measuring an quantity of light, to determine an operation signal by detecting a difference of quantity of light passing the light guide pad in response to operation of the pattern sheet.

2. Description of Related Art

A keypad is a switching device configured for a user of a mobile phone and/or terminal to generate a signal.

A typical keypad is illustrated in FIG. 1 The keypad includes a key top 180 printed or engraved with a recognition symbol including a number and/or a letter, and a base 120 positioned underneath a front housing 140 connected via a connector 130.

The keytop 180 and the base 120 are coupled to the front housing 140 forming an exterior look of a mobile phone to form a key button 100, and the keytop 180 protrudes to an external side of a hole formed at the front housing 140.

A printed circuit board (PCB. 160) attached with a dome switch 150 is coupled at a predetermined distance from the keytop 180 to a lower end of the keytop 180 and the base 120. The keytop 180 is formed thereunder with a protruder 110 for pressing the dome switch 150, and a light source 170 is formed at a rear surface of the keytop 180 to allow a user to recognize the letter or a figure printed at a periphery of the keytop 180 even at night.

The light source 170 primarily uses an LED, and the recent trend for the light source 170 is to use a thin film EL sheet that is slim, uniform in light and consumes less power.

However, the conventional keypad suffers from a disadvantage in that light generated from the light source 170 is irradiated to an entire area of the keypad to vanish into a space between the buttons 180 and to provide a difficulty in concentratively illuminating the button 180 alone.

There is another disadvantage in the conventional keypad in that the light sources 170 are respectively mounted at the PCB 160 between the buttons 180 of the keypad to inevitably illuminate the entire area of the keypad, thereby necessitating installation of 12 to 20 or more light sources 170, for example, whereby the manufacturing cost increases and the power for the mobile phone and the terminal is over-spent.

Still another disadvantage is that there occurs a light deviation where ambient of the light source 170 is bright while a distanced area from the light source 170 is dark.

BRIEF SUMMARY

An object of the present disclosure is to substantially solve at least the above problems and/or disadvantages, and to provide a keypad with a light guide pad configured to reduce the defect rate and the manufacturing cost of manufactured keypad by decreasing the number of used elements, for instance, light sources and buttons, without generating mechanical problems caused by contact failure between printed circuit boards and buttons generating a signal of the keypad.

In one general aspect of the present disclosure, a keypad is provided, the keypad comprising: a light source allowing light to be incident on the light guide pad; a sensor detecting quantity of light having passed the light guide pad; and a light quantity changer changing the quantity of light having passed the light guide pad.

The keypad with a light guide pad has an advantageous effect in that no mechanical contact defect is generated and the number of parts used for the keypad is reduced to decrease the defect rate and manufacturing cost of manufactured keypads by detecting a difference of quantity of light generated by a light source, not by generating an operation signal using the key button to contact the printed circuit board.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

A keypad according to the present disclosure will be described in detail with reference to the accompanying drawings.

A keypad according to the present disclosure comprises: a light guide pad; a light source allowing light to be incident on the light guide pad; a sensor detecting quantity of light having passed the light guide pad; and a light quantity changer changing the quantity of light having passed the light guide pad.

The keypad, positioned at an upper surface of the printed circuit board (PCB) of a hand-held phone, a mobile phone and/or terminal, is connected to a housing of the hand-held phone, the mobile phone and/or the terminal, and printed or engraved with recognition symbols including letters and/or numbers. To be more specific, in a case a key is depressed responsive to the recognition symbols including the numbers and/or letters, the keypad detects an operation signal corresponding to the depressed key.

Although the present disclosure may be implemented in various modifications and exemplary embodiments, particular exemplary embodiments will be illustrated and detailed explanation thereof will be provided. The exemplary embodiments may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. Accordingly, the described aspect is intended to embrace all such alterations, modifications, and variations that fall within the scope and novel idea of the present disclosure.

Meanwhile, the terminology used herein is for the purpose of describing particular implementations only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components and/or groups thereof.

Whereas the present disclosure has been described in particular relation to the drawings attached hereto, it should be understood that other and further modifications apart from those shown or suggested herein, may be made within the scope and spirit of the present disclosure.

Figure 1:
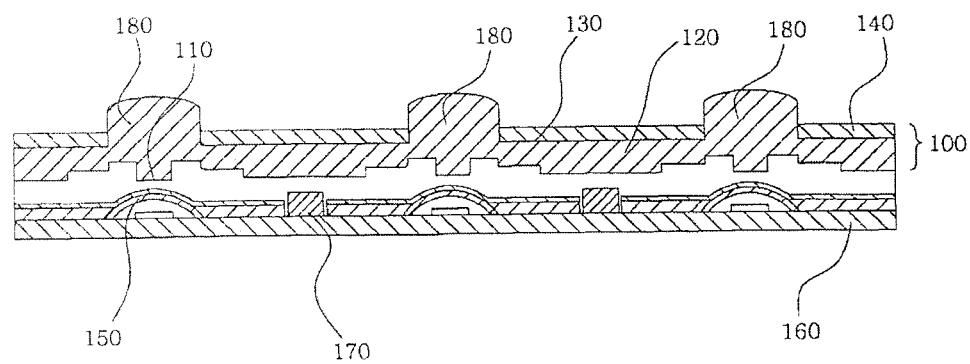
FIG. 1 is a cross-sectional view of a keypad mounted to a mobile phone according to prior art.
Figure 2:
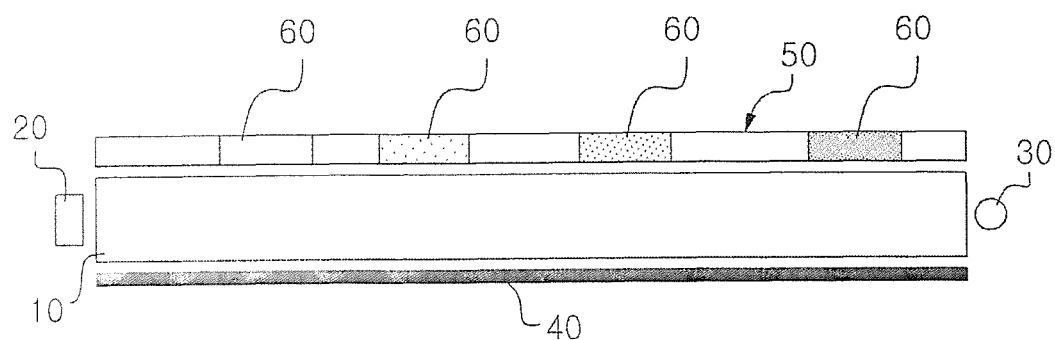
FIG. 2 is a cross-sectional view of a keypad according to the present disclosure.
Figure 3:
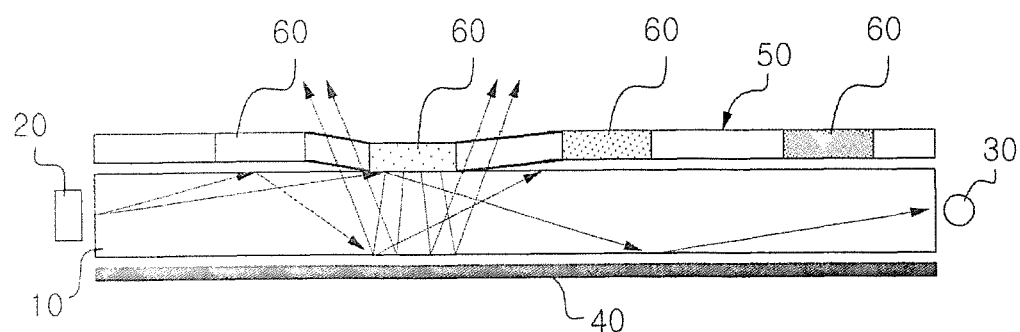
FIG. 3 is a schematic view explaining an operational aspect of a keypad according to the present disclosure.
Figure 4:
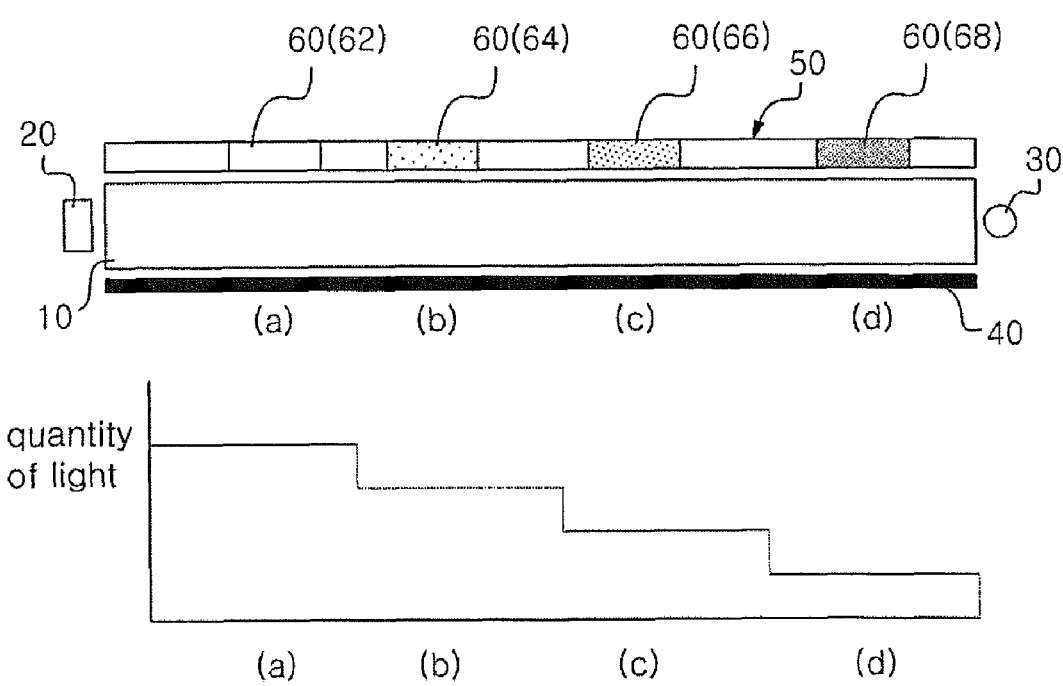
FIG. 4 is a schematic view illustrating quantity of light in response to an embossed pattern of a keypad according to the present disclosure.

FIG. 2 is a cross-sectional view of a keypad according to the present disclosure, FIG. 3 is a schematic view explaining an operational aspect of a keypad according to the present disclosure, and FIG. 4 is a schematic view illustrating quantity of light in response to an embossed pattern of a keypad according to the present disclosure.

Referring to FIGS. 2 through 4, the keypad according to the present disclosure comprises: a light guide pad 10; a light source 20 allowing light to be incident on the light guide pad 10; a sensor 30 detecting quantity of light having passed the light guide pad 10; and a light quantity changer changing the quantity of light having passed the light guide pad 10.

Preferably, the light incident on the light guide pad 10 from the light source 20 is so configured as to be totally reflected from the light guide pad 10 and to be outputted to the sensor 30.

In a case the light quantity changer releases, if touched, the total reflection of light passing through a partial area of the light guide pad 10 to change the light quantity detected by the sensor 30. The light quantity changer may be integrally formed with the light guide pad 10.

Furthermore, the light quantity changer is discretely positioned from the light guide pad 10, and brought into contact with the light guide pad 10, if touched, to release the total reflection of light passing through the light guide pad 10, whereby the light quantity detected by the sensor 30 is changed.

Accordingly, in a case a predetermined area of the light quantity changer is touched, an area of the light guide pad 10 corresponding to the predetermined area of the light quantity changer is released of the total reflection of light to change the quantity of light incident on the sensor 30.

Preferably, the keypad according to the present disclosure is so configured as to allow the light released of the total reflection to be leaked to the outside of the light guide pad 10. Therefore, the light quantity detected by the sensor 30 is changed, by which it can be known that the predetermined area has been touched.

Furthermore, the light source 20 is arranged at one side of the light guide pad 10, and the sensor 30 is arranged at the other side opposite to the one side of the light guide pad 10, such that the light incident from the light source 20 passes through the light guide pad 10 and the light having passed the light guide pad 10 is detected by the sensor 30.

Referring to FIG. 2, the light quantity changer may be formed with a pattern sheet 50 formed with patterns. The pattern sheet 50 is preferably positioned at an upper side of the light guide pad 10. The keypad according to the present disclosure may be further formed at a lower side of the light guide pad 10 with a reflection plate 40.

Furthermore, the light guide pad is preferably positioned between the light source 20 and the sensor 30. The light guide pad 10 is preferably formed with a transparent material.

Now, the keypad according to the present disclosure will be described with the light quantity changer being applied as the pattern sheet 50.

The light guide pad 10 according to the present disclosure is made to move to a sensor-positioned direction along the light guide pad 10 as the light incident from a lateral surface of the light source 20 is totally reflected from a surface of the light guide pad 10.

The light guide pad 10 is formed therein with a tinting material to facilitate the light incident from the light source 20 to be easily scattered. The scattered light may be utilized as a background lighting of the keypad. The tinting material is a material capable of scattering light, and may include all the materials called tinting materials in the art and light scattering materials.

The light source 20 may include a light source typically used in the hand-held phones, mobile phones and/or terminals, and is not particularly limited to the LED.

The sensor 30 according to the present disclosure is arranged on the other side opposite to the one side of the light guide pad 10 where the light source 20 is positioned, to detect the quantity of light passing through the light guide pad 10.

The light quantity detected by the sensor 30, i.e., the amount of light, is transmitted to a circuit (not shown) of the hand-held phones, mobile phones and/or terminals from which a signal determined by the transmitted light quantity, i.e., an operation signal is generated.

The reflection plate 40 is formed at a lower end of the light guide pad 10 to reflect upwards the light reflected in response to the light incident to the light guide pad 10 and/or the operation of pattern sheet. Therefore, any conventional reflection plate 40 known in the art that is utilized for the reflection purpose may be provided to the present disclosure.

The pattern sheet 50 according to the present disclosure is a sheet capable of diffusing and/or scattering the light incident from the lateral surface of the light guide pad 10 upwards of the light guide pad 10, i.e., to the vertical direction of the light guide pad 10.

The pattern sheet 50 used for the purpose may be implemented by a transparent film or a transparent sheet formed with a plurality of pattern areas on the surface. The plurality of pattern areas on the pattern sheet 50 may be implemented by one of raised patterns, depressed engravings or the combination thereof. For example, the plurality of pattern areas may be implemented by a pattern printed with letters or figures.

The pattern area may be preferably protruded from the pattern sheet 50 and brought into contact with the light guide pad 10, in a case the pattern sheet is depressed.

That is, in a case the pattern area is brought into contact with the light guide pad 10, the amount of light progressing to the light guide pad 10 may be increased or decreased to recognize a touched area of the keypad by releasing the total reflection of light advancing to the light guide pad 10.

For information, FIG. 3 illustrates a raised pattern 60 on the pattern area. Meanwhile, the plurality of raised patterns 60 may be individually formed at a lower end of the pattern sheet 50 each with a different pattern density. The plurality of raised patterns 60, each with different density may be formed in such a manner that density of the raised pattern 60 sequentially increases or decreases based on a direction the sensor 30 is positioned.

Preferably, the plurality of raised patterns 60 is so formed as to allow the density of the plurality of raised pattern 60 to increase or decrease from the light source 20 to a direction to the sensor 30. That is, in a case the density of the plurality of raised patterns increases or decreases, it would be easy to detect which raised pattern has been touched responsive to the quantity of light detected by the sensor 30.

Furthermore, the pattern sheet 50 is partially deformable due to its being made of a flexible material. At this time, the partial deformation is such that a pattern formed at the lower end of the pattern sheet 50, i.e., the raised pattern 60, is deformed downwards to be brought into contact with the light guide pad 10, in a case the pattern sheet 50 is depressed by an external force.

As apparent from the foregoing, the pattern sheet 50 may maintain a discrete state from the light guide pad 10, in a case the pattern sheet 50 is not affected by the external force.

Now, the operation of the keypad thus configured according to the present disclosure will be described.

First of all, in a case a relevant key displayed on the pattern sheet 50 formed at the upper side of the keypad is depressed to perform a desired operation of the hand-held phones, mobile phones and/or terminals, the raised pattern 60 formed at the lower end of the relevant key comes to depress a relevant portion of the light guide pad 10, whereby the raised pattern 60 changes a corresponding surface of the light guide pad 10 to make the total reflection condition irregular.

Next, a light scattering is generated by the raised pattern 60 from the portion where the total reflection condition of the light guide pad 10 is irregular, and the scattered light is reflected by the reflection plate 40 at the lower end of the light guide pad 10 to illuminate the corresponding key portion of the keypad, and at the same time to allow the light corresponding to the density of the depressed raised pattern 60 to be incident on the sensor 30 which in turn detects the light quantity.

Successively, the sensor 30 having detected the light quantity transmits the light quantity value to a circuit to operate the hand-held phones, mobile phones and/or terminals in response to the relevant signal.

At this time, a difference of quantity of light incident on the sensor 30 is detected responsive to the density of raised pattern 60 formed at the pattern sheet 50, where the difference of light quantity is numerated and converted to light quantity value to implement the operation of the hand-held phones, mobile phones and/or terminals based on the relevant signal.

For example, FIG. 3 shows an operation aspect where, in a case one of the plurality of raised patterns 60 is depressed to manipulate the keypad, the light is scattered from the light guide pad 10, i.e., from the lower end of the depressed raised pattern 60, and reflected by the reflection plate 40.

As another example in FIG. 4, each of the sequential raised patterns on the pattern sheet 50 is arbitrarily designated as (62), (64), (66) and (68), and in a case each of raised patterns (62), (64), (66) and (68) is depressed, the scattered light quantity shows a gradual difference in a graph due to density difference of the relevant raised patterns, where the difference of quantity value of light incident on the sensor 30 is converted to allow the user to determine a corresponding signal of the operating key.

In a case the relevant raised patterns (62), (64), (66) and (68) in FIG. 4 are respectively designated as (a), (b), (c) and (d), the light quantity of relevant raised patterns (62), (64), (66) and (68) is shown by the lower graph in a case the raised patterns (62), (64), (66) and (68) are depressed.

Although the present disclosure has been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A keypad comprising:
   a light guide pad;
   a light source allowing light to be incident on the light guide pad;
   a sensor detecting quantity of light having passed the light guide pad; and
   a light quantity changer changing the quantity of light having passed the light guide pad,
   wherein the light source is arranged at one side of the light guide pad, and the sensor is arranged at the other side facing the one side of the light guide pad.

2. The keypad of claim 1, wherein the light guide pad, in a case of being touched, releases the total reflection of light passing to a partial area of the light guide pad to change the light quantity detected by the sensor.

3. The keypad of claim 1, wherein the light quantity changer is discretely positioned from the light guide pad, and brought into contact with the light guide pad to release the total reflection of light passing the light guide pad, in a case of being touched.

4. The keypad of claim 1, wherein the light quantity changer is a pattern sheet formed with patterns.

5. The keypad of claim 4, wherein the pattern sheet is positioned at an upper side of the light guide pad.

6. The keypad of claim 5, further comprising a reflection plate at a lower side of the light guide pad.

7. The keypad of claim 4, wherein the pattern sheet is formed with a plurality of pattern areas on the surface.

8. The keypad of claim 7, wherein the plurality of pattern areas of the pattern sheet is one of a raised pattern, a depressed pattern or a combination thereof.

9. The keypad of claim 7, wherein the plurality of pattern areas is protruded from the pattern sheet, and in a case the pattern sheet is depressed, the pattern area is brought into contact with the light guide pad.

10. The keypad of claim 7, wherein each of the plurality of pattern areas is differently formed with pattern density.

11. A keypad comprising:
   a light guide pad;
   a light source allowing light to be incident on the light guide pad;
   a sensor detecting quantity of light having passed the light guide pad; and
   a light quantity changer changing the quantity of light having passed the light guide pad,
   wherein the light quantity changer is a pattern sheet formed with patterns,
      wherein the pattern sheet is formed with a plurality of pattern areas on the surface, and
      wherein the plurality of pattern areas sequentially increases or decreases in density based on a direction the sensor is positioned.

12. A keypad comprising:
a light guide pad;
a light source allowing light to be incident on the light guide pad;
a sensor detecting quantity of light having passed the light guide pad; and
a light quantity changer changing the quantity of light having passed the light guide pad,
wherein the light quantity changer is a pattern sheet formed with patterns,
    wherein the pattern sheet is formed with a plurality of pattern areas on the surface, and
    wherein the density of the plurality of pattern areas increases or decreases towards a direction from the light source to the sensor.

13. The keypad of claim 1, wherein the light guide pad is positioned between the light source and the sensor.

14. The keypad of claim 4, wherein the pattern sheet is made of flexible material to be partially deformed.

15. The keypad of claim 4, wherein the pattern sheet maintains a discrete state from the light guide pad to be partially brought into contact with an upper surface of the light guide pad responsive to an external force.

16. The keypad of claim 1, wherein the light guide pad is made of a transparent silicone.

17. The keypad of claim 16, wherein the transparent silicone includes a tinting agent.

18. The keypad of claim 1, wherein the light source is an LED.

19. The keypad of claim 1, wherein the light incident from the light source on the light guide pad is totally reflected from the light guide pad to be outputted to the light source.

* * * * *